(12) United States Patent
Cheng et al.

(10) Patent No.: US 10,205,003 B1
(45) Date of Patent: Feb. 12, 2019

(54) SURFACE ROUGHNESS OF III-V FIN FORMED ON SILICON SIDEWALL BY IMPLEMENTING SACRIFICIAL BUFFERS

(71) Applicant: International Business Machines Corporation, Armonk, NY (US)

(72) Inventors: Cheng-Wei Cheng, White Plains, NY (US); Sanghoon Lee, White Plains, NY (US); Effendi Leobandung, Stormville, NY (US); Renee T. Mo, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/871,830

(22) Filed: Jan. 15, 2018

(51) Int. Cl.
*H01L 21/00* (2006.01)
*H01L 21/84* (2006.01)
*H01L 29/66* (2006.01)
*H01L 21/762* (2006.01)
*H01L 21/02* (2006.01)
*H01L 21/306* (2006.01)
*H01L 21/3105* (2006.01)
*H01L 21/308* (2006.01)

(52) U.S. Cl.
CPC .. *H01L 29/66795* (2013.01); *H01L 21/02461* (2013.01); *H01L 21/02463* (2013.01); *H01L 21/02546* (2013.01); *H01L 21/02598* (2013.01); *H01L 21/3081* (2013.01); *H01L 21/30612* (2013.01); *H01L 21/31053* (2013.01); *H01L 21/7624* (2013.01); *H01L 29/66522* (2013.01)

(58) Field of Classification Search
None
See application file for complete search history.

(56) References Cited

U.S. PATENT DOCUMENTS

| | | | |
|---|---|---|---|
| 9,520,469 B1 * | 12/2016 | Balakrishnan | H01L 21/823821 |
| 9,685,440 B1 * | 6/2017 | Cheng | H01L 27/0886 |
| 10,083,986 B2 * | 9/2018 | Cheng | H01L 27/1211 |
| 2015/0041812 A1 * | 2/2015 | Cheng | H01L 27/0886 257/57 |
| 2015/0325665 A1 * | 11/2015 | Masuoka | H01L 21/823431 257/329 |
| 2016/0211338 A1 * | 7/2016 | Wang | H01L 21/823481 |
| 2018/0047575 A1 * | 2/2018 | Cheng | H01L 29/785 |

* cited by examiner

*Primary Examiner* — Angel Roman
(74) *Attorney, Agent, or Firm* — L. Jeffrey Kelly, Esq.; Hoffmann & Baron, LLP

(57) ABSTRACT

A method for use in forming a fin of a field-effect transistor includes: patterning a mandrel into a substrate at least by recessing portions of the substrate; forming dielectric material at least on the recessed portions of the substrate, wherein the dielectric material partially covers exterior sidewalls of the mandrel; forming a first buffer at least on a portion of the exterior sidewalls of the mandrel not covered by the dielectric material; forming a second buffer at least on exterior sidewalls of the first buffer; forming a semiconductor channel at least on the dielectric material, wherein at least the second buffer is between the channel and the mandrel; exposing interior sidewalls of at least the first buffer at least by removing the mandrel; and removing the first buffer and the second buffer without removing the channel.

20 Claims, 10 Drawing Sheets

SURFACE ROUGHNESS OF III-V FIN FORMED ON SILICON SIDEWALL BY IMPLEMENTING SACRIFICIAL BUFFERS

BACKGROUND

The present invention relates to the electrical, electronic, and computer arts, and, more particularly, to methods for forming fins in integrated circuits comprising FinFETs.

Multi-gate field-effect transistors (FETs) are of considerable interest because of their superior electrostatic integrity, as well as their promise of lower supply voltages, reduced threshold voltages, and extended scalability. FinFETs are one form of such multi-gate device. In a FinFET, a narrow channel feature (i.e., fin) is raised above the substrate and passes under a gate, which effectively wraps around the fin. The gate is thereby capacitively coupled to the top as well as the sides of the fin. So structured, very little leakage current passes through channel portions of the fin when the device is in the off state. This allows the use of lower threshold voltages and higher switching speeds.

Fins comprising III-V semiconductor material (i.e., III-V fins) can be formed on (111) silicon sidewalls by introducing a wetting layer prior to growing the III-V fins, so that the III-V fins have a growth-front which is single crystalline (111) faceted. After the silicon mandrels are pulled to release these III-V fins, it is often found that the side which was the interface between the silicon sidewalls and the III-V semiconductor (i.e., the Si-IIIV interface) has a significantly rougher surface than the opposite side (i.e., the growth-front). The poor surface roughness of III-V fins can potentially limit electron transport properties, such as mobility and/or injection velocity, thus producing undesirable effects.

SUMMARY

A method for use in forming a fin of a field-effect transistor includes: patterning a mandrel into a substrate at least by recessing portions of the substrate; forming dielectric material at least on the recessed portions of the substrate, wherein the dielectric material partially covers exterior sidewalls of the mandrel; forming a first buffer at least on a portion of the exterior sidewalls of the mandrel not covered by the dielectric material; forming a second buffer at least on exterior sidewalls of the first buffer; forming a semiconductor channel at least on the dielectric material, wherein at least the second buffer is between the channel and the mandrel; exposing interior sidewalls of at least the first buffer at least by removing the mandrel; and removing the first buffer and the second buffer without removing the channel.

Additional aspects of the invention are directed to a field-effect transistor (e.g., FinFET) formed at least in part using a method like that set forth in the previous paragraph.

Techniques of the present invention can provide substantial beneficial technical effects. An illustrative embodiment of the present invention may advantageously improve the surface roughness of the Si-IIIV interface by implementing sacrificial buffer layers. Thus, an illustrative embodiment of the present invention may improve electron transport properties, such as mobility and/or injection velocity, relative to conventional techniques. An illustrative embodiment of the present invention may also release fins by selectively removing the aforementioned buffer layers.

BRIEF DESCRIPTION OF THE SEVERAL VIEWS OF THE DRAWINGS

These and other features, aspects, and advantages of the present invention will become better understood with regard to the following description, appended claims, and accompanying drawings where:

It is to be appreciated that elements in the figures are illustrated for simplicity and clarity. Common but well-understood elements that may be useful or necessary in a commercially feasible embodiment may not be shown in order to facilitate a less hindered view of the illustrated embodiments. In the sectional views included herein, features present behind the sectional planes are not shown to reduce clutter and enhance clarity.

DETAILED DESCRIPTION

Principles of the present disclosure will be described herein in the context of an illustrative fin structure, and processing methods for forming same. It is to be appreciated, however, that the specific structures and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred. It is emphasized that while some individual processing steps may be set forth herein, those steps are merely illustrative, and one skilled in the art may be familiar with several equally suitable alternatives that would also fall within the scope of the invention.

It is to be appreciated that the various layers, regions and/or components shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Figure 1:
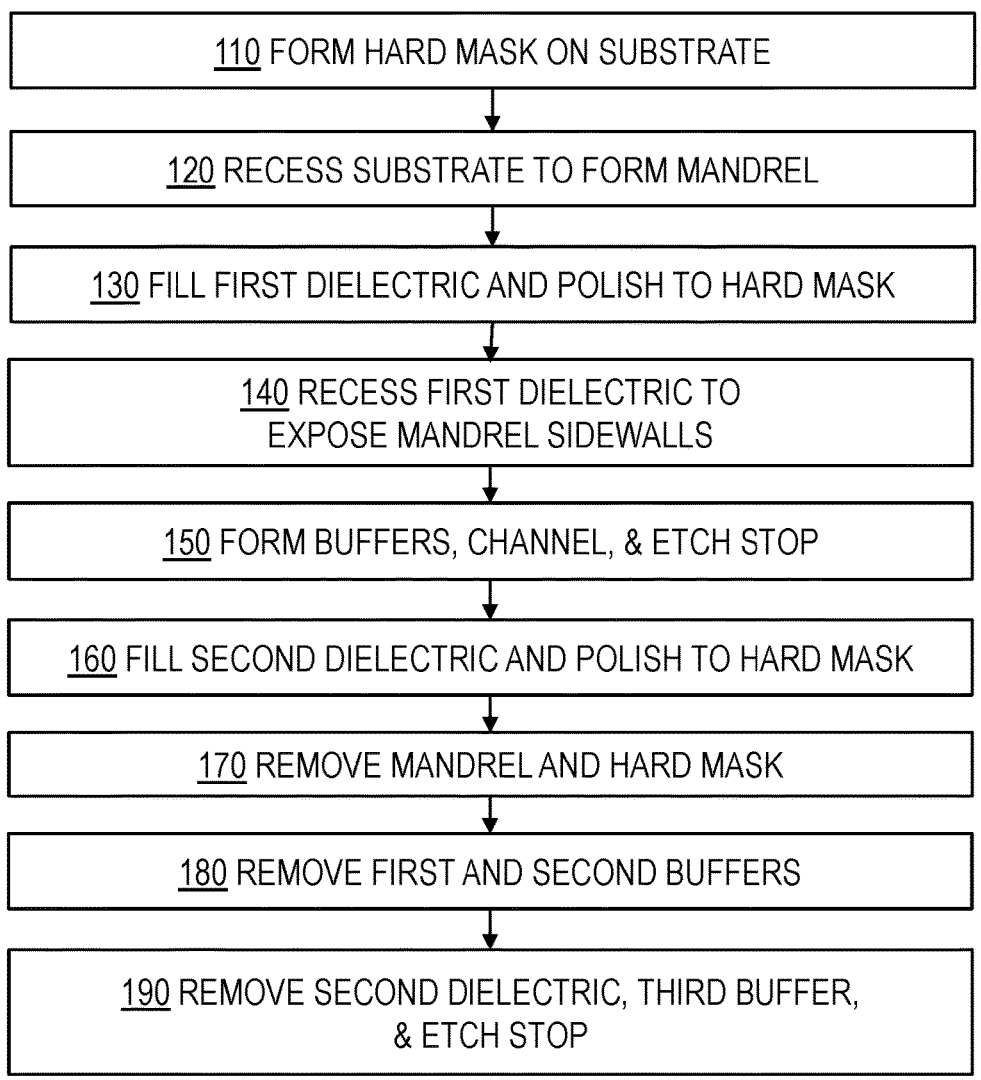
FIG. 1 shows a method for forming a fin, in accordance with an illustrative embodiment of the invention.

FIG. 1 shows a flow diagram of a method 100 for forming a fin (e.g., in a FinFET), in accordance with an illustrative embodiment of the invention. Although the method 100 and the structures formed thereby are entirely novel, many of the individual processing steps required to implement the method 100 may utilize conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications, for example, S. Wolf and R. N. Tauber, *Silicon Processing for the VLSI Era, Volume* 1, Lattice Press, 1986; S. Wolf, *Silicon Processing for the VLSI Era, Vol. 4: Deep-Submicron Process Technology*, Lattice Press, 2003; and S. M. Sze, *VLSI Technology, Second Edition*, McGraw-Hill, 1988, all of which are incorporated by reference herein. It is also emphasized that the descriptions provided herein are not intended to encompass all of the processing steps that may be required to successfully form a functional device. Rather, certain processing steps that are conventionally used in forming integrated circuit devices, such as, for example, wet cleaning steps, are purposefully not described herein for economy of description. However, one skilled in the art will readily recognize those processing steps omitted from this more generalized description. Structural and functional aspects of FinFETs are described in J. G. Fossum et al., *Fundamentals of Ultra-Thin-Body MOSFETs and FinFETs*, Cambridge University Press, 2013, which is also hereby incorporated by reference herein.

Figure 2:
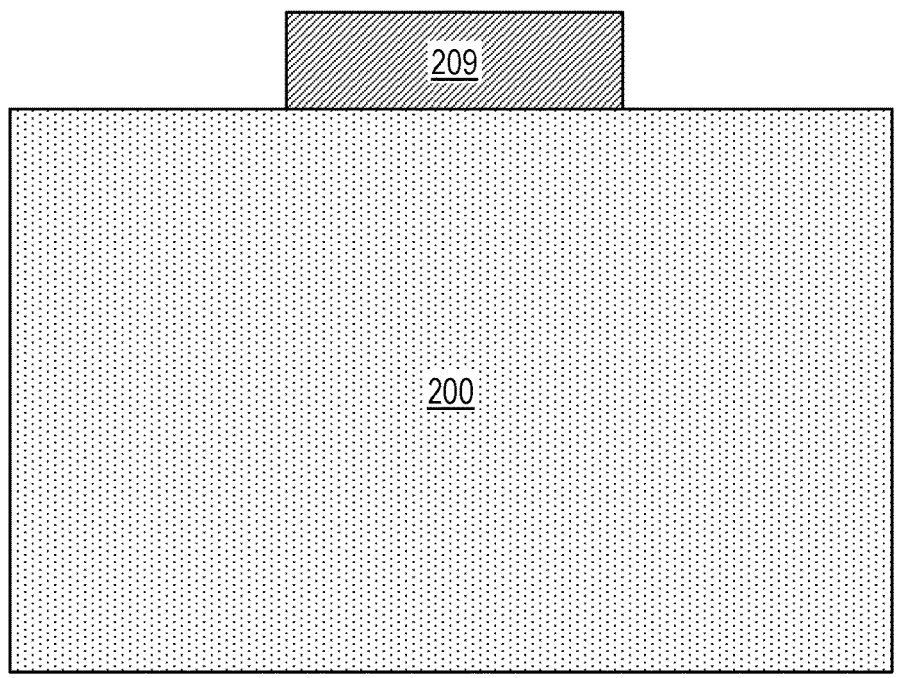
FIGS. 2-10 are cross-sectional views depicting intermediate processing steps in an overall method for forming a fin, according to one or more embodiments of the invention.

FIG. 2 shows an exemplary device after performing step 110 of method 100 shown in FIG. 1. In step 110 of method 100 shown in FIG. 1, a hard mask 209 is formed (e.g., grown and/or deposited and then etched into a pattern) on a substrate (200). Hard mask 209 is preferably a dielectric material, and may comprise an oxide and/or nitride. For example, hard mask 209 may comprise a silicon nitride ($Si_xN_y$), such as $Si_3N_4$, and/or a silicon oxide ($SiO_x$), such as $SiO_2$. In an illustrative embodiment, substrate 200 may comprise silicon (Si) having a (110) orientation, and hard mask 209 may comprise $Si_3N_4$. Substrate 200 could additionally or alternatively comprise silicon-germanium (SiGe) and/or germanium (Ge). Substrate 200 could additionally or alternatively comprise silicon-on-insulator (SOI), silicon-germanium-on-insulator (SGOI), and/or germanium-on-insulator (GOI).

Figure 3:
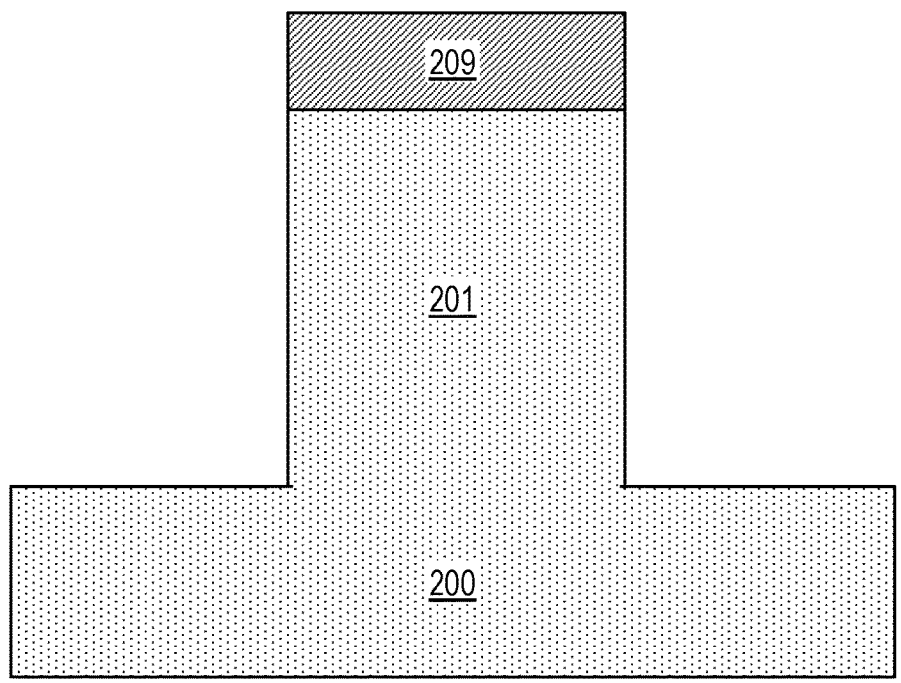

FIG. 3 shows an exemplary device after performing step 120 of method 100 shown in FIG. 1. In step 120 of method 100, mandrel 201 is patterned into substrate 200. More particularly, portions of substrate 200 which are not underneath hard mask 209, and thus are exposed, are recessed (e.g., partially removed). Thus, the portion of substrate 200 underneath hard mask 209, which is not recessed, forms a mandrel 201. In an illustrative embodiment, substrate 200 may have a (110) orientation, but mandrel 201 may have (111) faceted sidewall formations.

Figure 4:
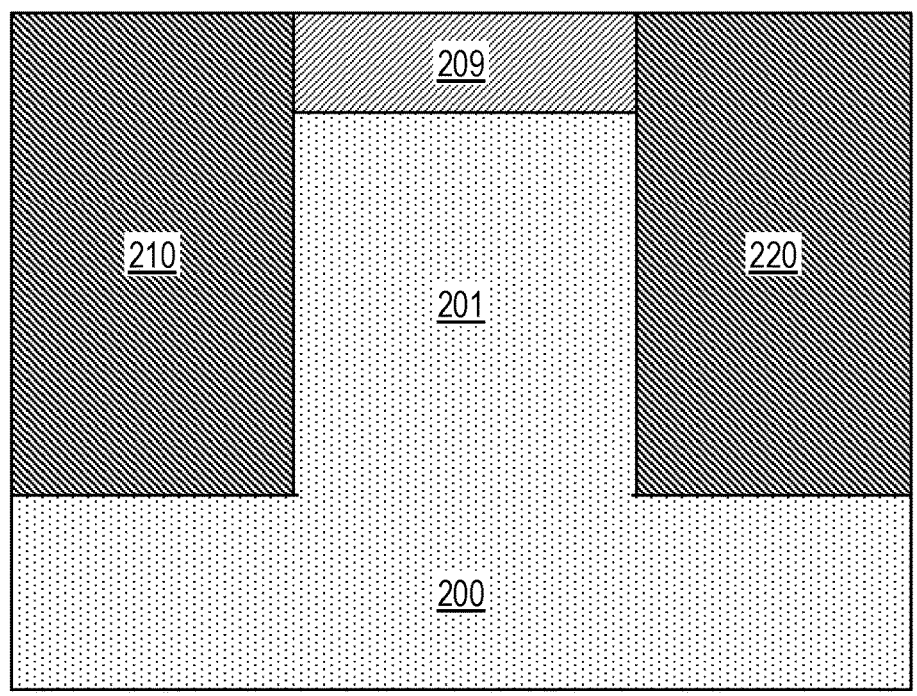

FIG. 4 shows an exemplary device after performing step 130 of method 100 shown in FIG. 1. In step 130 of method 100, a first dielectric fill (210 and 220) is applied to the recessed portions of substrate 200, and then polished to hard mask 209. First dielectric fill 210 and 220 may comprise an oxide and/or nitride. For example, first dielectric fill 210 and 220 may comprise a silicon nitride ($Si_xN_y$), such as $Si_3N_4$, and/or a silicon oxide ($SiO_x$), such as $SiO_2$. In an illustrative embodiment, substrate 200 (and thus mandrel 201) may comprise silicon, hard mask 209 may comprise $Si_3N_4$, and first dielectric fill 210 and 220 may comprise $SiO_2$. Mandrel 201 and hard mask 209 are laterally surrounded by first dielectric fill 210 and 220, but first dielectric fill 210 and 220 does not extend higher than hard mask 209.

Figure 5:
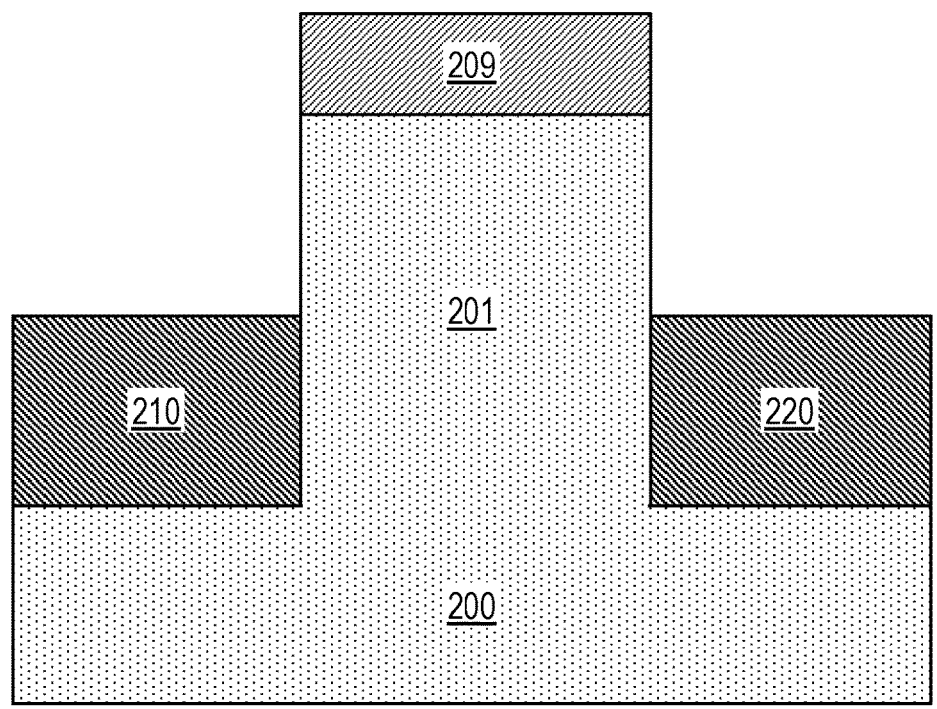

FIG. 5 shows an exemplary device after performing step 140 of method 100 shown in FIG. 1. In step 140 of method 100, the first dielectric fill (210 and 220) is recessed to expose sidewalls of at least a portion of mandrel 201. The first dielectric fill (210 and 220) is recessed (e.g., partially removed), such that at least an upper portion of mandrel 201 protrudes above, and thus is no longer laterally surrounded by, first dielectric fill 210 and 220. A portion of the first dielectric fill 210 and 220 remains on substrate 200 and may laterally surround at least a lower portion of mandrel 201.

Figure 6:
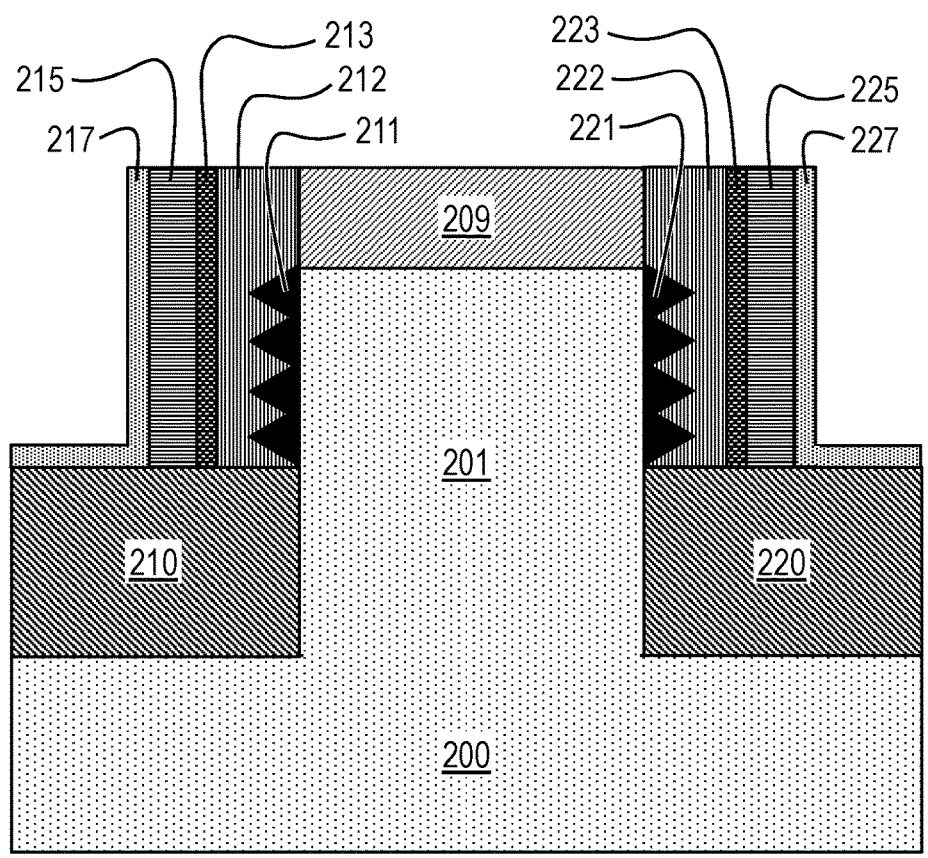

FIG. 6 shows an exemplary device after performing step 150 of method 100 shown in FIG. 1. In step 150, first buffer (211 and 221), second buffer (212 and 222), third buffer (213 and 223), channel (215 and 225), and etch stop (217 and 227) are formed. First buffer 211 and 221 may be formed on exposed exterior sidewalls of mandrel 201, and specifically on exterior sidewalls of the upper portion of mandrel 201 which protrudes above first dielectric fill 210 and 220. Although not shown in FIG. 6, first buffer 211 and 221 may also be formed on exposed exterior sidewalls of hard mask 209. First buffer 211 and 221 may comprise a wetting layer to ensure growth uniformity, which may comprise a III-V material, e.g., aluminum arsenide (AlAs). In some embodiments, such as that shown in FIG. 3, first buffer 211 and 221 may comprise a plurality of islands (which may comprise, for example, cones as shown in FIG. 6 and/or frustrums) formed on exposed exterior sidewalls of mandrel 201 (e.g., due to Volmer-Weber growth); these islands may optionally be connected by a thin layer of first buffer 211 and 221 formed on sidewalls of mandrel 201 (e.g., due to Stranski-Krastanov growth). In the embodiment shown in FIG. 6, first buffer 211 and 221 is not formed on sidewalls of hard mask 209.

Second buffer 212 and 222 may be formed on exposed exterior sidewalls of first buffer 211 and 221, and of hard mask 209. Second buffer 212 and 222 may also be formed on exterior sidewalls of mandrel 201 which remain exposed after first buffer 211 and 221 is formed. At least a portion of the bottom surface of second buffer 212 and 222 may be formed on a top surface of first dielectric fill 210 and 220. Second buffer 212 and 222 preferably has a substantially uniform thickness measured relative to mandrel 201 and hard mask 209, rather than conforming to first buffer 211 and 221, which in turn may be completely covered by second buffer 212 and 222. Second buffer 212 and 222 comprises an interlayer which creates a single crystalline growth-front facet to smooth out the growth of channel 215 and 225. Second buffer 212 and 222 may comprise a III-V material, e.g., indium gallium arsenide (InGaAs), indium phosphide (InP), indium aluminum phosphide (InAlP), and/or indium aluminum arsenide (InAlAs).

Third buffer 213 and 223 may be formed on exposed exterior sidewalls of second buffer 212 and 222. At least a portion of the bottom surface of third buffer 213 and 223 may be formed on a top surface of first dielectric fill 210 and 220. Third buffer 213 and 223 comprises an etch stop layer to protect the channel 215 and 225 during removal of, for example, second buffer 212 and 222, discussed below with reference to step 180 in FIG. 1 and to FIG. 9. Third buffer 213 and 223 may comprise a III-V material such as, e.g., aluminum arsenide (AlAs). Thus, in some embodiments, third buffer 213 and 223 may have a composition similar to first buffer 211 and 221. As will be further discussed below, in some embodiments, third buffer 213 and 223 may be omitted.

Channel 215 and 225 may be formed (e.g., grown) on exposed exterior sidewalls of third buffer 213 and 223. Where third buffer 213 and 223 is omitted, channel 215 and 225 may be formed (e.g., grown) on exposed exterior sidewalls of second buffer 212 and 222. At least a portion of the bottom surface of channel 215 and 225 may be formed on a top surface of first dielectric fill 210 and 220. Channel 215 and 225 may comprise a semiconductor, and more particularly a III-V semiconductor. For example, channel 215 and 225 may comprise a single crystalline III-V semiconductor, such as indium gallium arsenide (InGaAs) and/or indium arsenide (InAs).

Etch stop 217 and 227 may be formed (e.g., grown or deposited) on exposed exterior sidewalls of channel 215 and 225, as well as on any exposed portions of the top surface of first dielectric fill 210 and 220. Etch stop 217 and 227 may also form on top of buffers 211, 212, 213, 221, 222, and 223, as well as on top of hard mask 209. Etch stop 217 and 227 may protect channel 215 and 225 during removal of first buffer 211 and 221 and second buffer 212 and 222, discussed below with reference to step 160 in FIG. 1 and to FIG. 6. Etch stop 217 and 227 may comprise the same material as third buffer 213 and 223, e.g., aluminum arsenide (AlAs). Alternatively, etch stop 217 and 227 may comprise a dielectric (e.g., an oxide or nitride), rather than a III-V material like third buffer 213 and 223, and thus may also protect channel 215 during removal of third buffer 213 and 223 and the second dielectric fill, as discussed below with reference to step 190 in FIG. 1 and to FIG. 10. For example, etch stop 217 and 227 may comprise aluminum oxide (e.g., alumina $Al_2O_3$), hafnium oxide (e.g., hafnia $HfO_2$), and/or boron nitride (BN).

Figure 7:
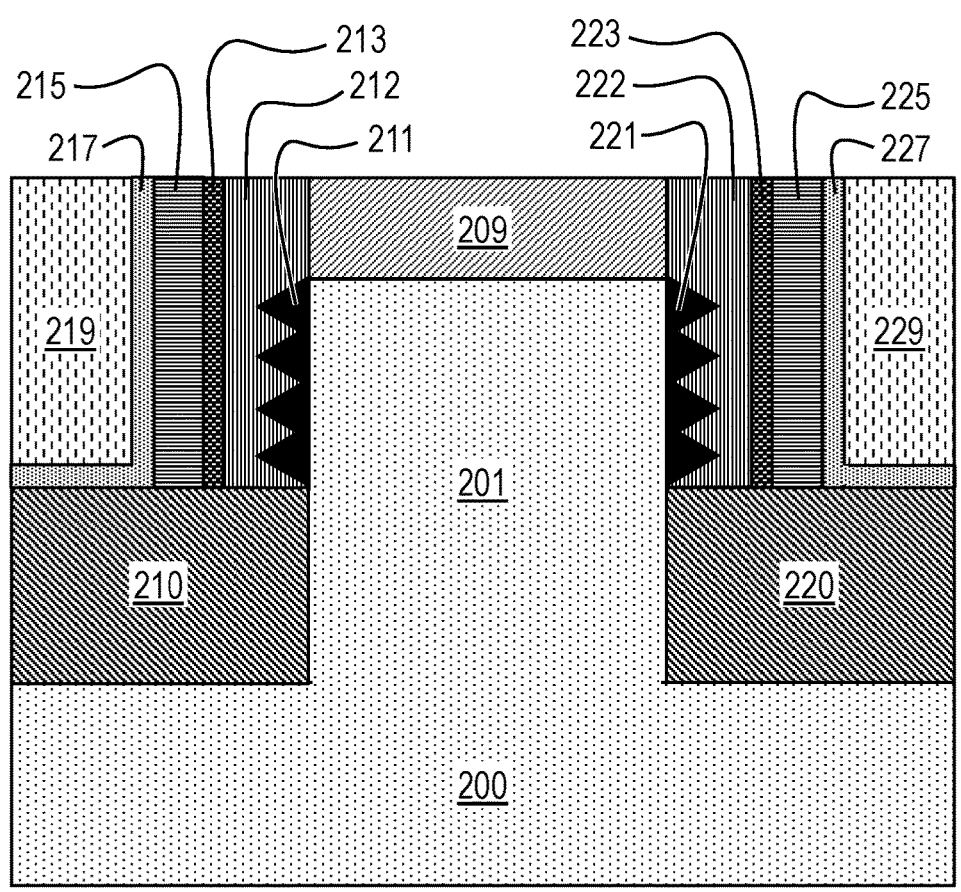

FIG. 7 shows an exemplary device after performing step 160 of method 100 shown in FIG. 1. In step 160, second dielectric fill 219 and 229 is filled in between mandrels (e.g., 201), e,g, formed on exposed sidewalls and top surfaces of etch stop 217 and 227, and then polished down to hard mask 209, thereby removing undesirable non-selective growth from the top of hard mask 209. For example, as noted above with reference to step 150 and FIG. 6, etch stop 217 and 227 may form on top of hard mask 209; etch stop 217 and 227 formed on top of hard mask 209 will be removed when the second dielectric fill 219 and 229 is polished down to the hard mask 209 in step 160. Second dielectric fill 219 and 229 may comprise an oxide and/or nitride. For example, second dielectric fill 219 and 229 may comprise a silicon nitride ($Si_xN_y$), such as $Si_3N_4$; a silicon oxide ($SiO_x$), such as $SiO_2$; and/or intrinsic silicon. Second dielectric fill 219 and 229 may or may not have a similar composition to first dielectric fill 210 and 220.

Figure 8:
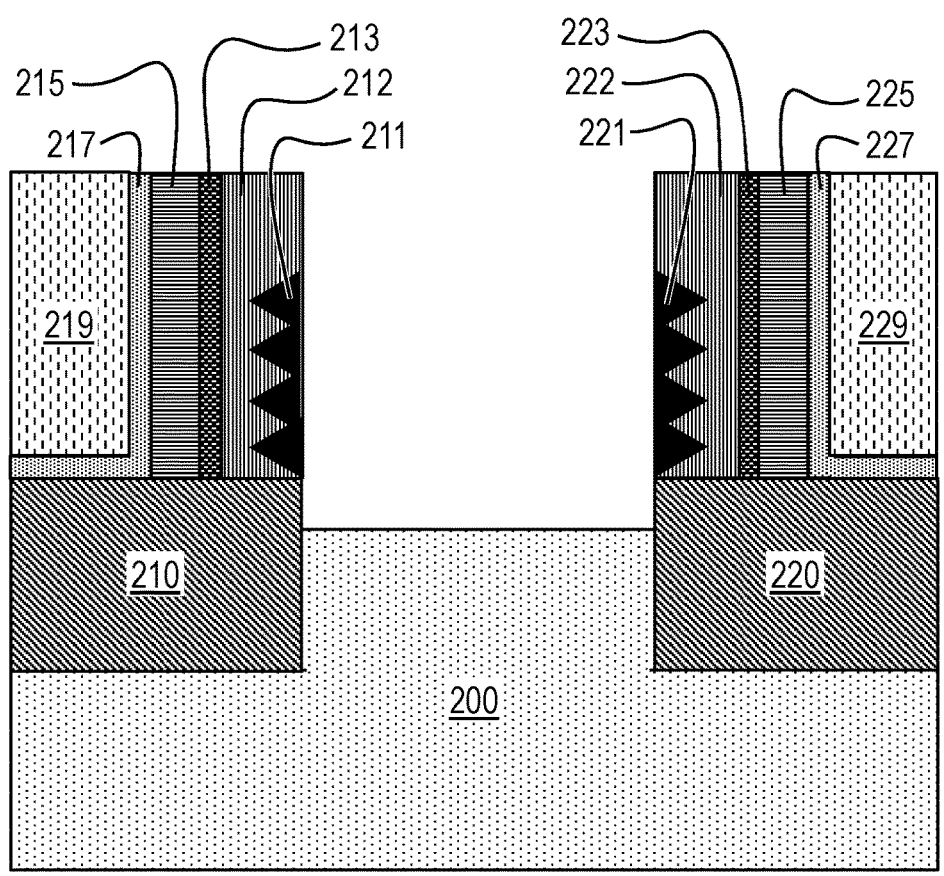

FIG. 8 shows an exemplary device after performing step 170 of method 100 shown in FIG. 1. In step 170, mandrel 201 is pulled (i.e., removed) from the remaining substrate 200, using for example, gas-phase chemistry, wet chemistry, and/or reactive ion etching (RIE). Hard mask 209 is also removed such that the portion of substrate 200 which is not below first dielectric fill 210 and 220 is exposed. Second dielectric fill 219 and 229, as well as etch stop 217 and 227, may protect first dielectric fill 210 and 220 during removal of mandrel 201 and hard mask 209. Removing mandrel 201 and hard mask 209 exposes interior sidewalls of first buffer 211 and 221, and of second buffer 212 and 222. In some embodiments, when mandrel 201 is removed, a portion of substrate 200 may remain between first dielectric fill 210 and 220 and/or at least a portion of interior sidewalls of first dielectric fill 210 and 220 may be exposed.

Step 170 may optionally include removing the second dielectric fill 219 and 229. However, in the embodiment shown in FIG. 8, the second dielectric fill 219 and 229 is instead removed during step 190, discussed below with reference to FIG. 10. When second dielectric fill 219 and 229 is removed, etch stop 217 and 227 (and possibly third buffer 213 and 223) protects channel 215 and 225, as well as first dielectric fill 210 and 220.

Figure 9:
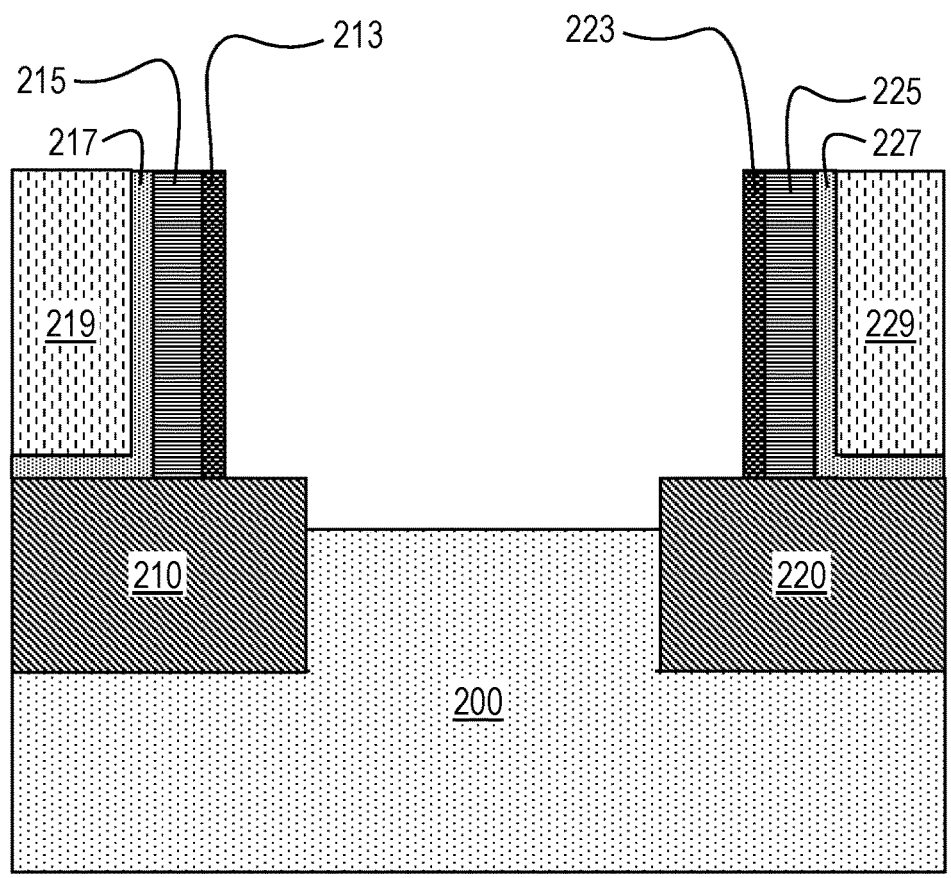

FIG. 9 shows an exemplary device after performing step 180 of method 100 shown in FIG. 1. In step 180, first buffer 211 and 221 and second buffer 212 and 222 are removed, preferably by wet etching. In some embodiments, a single etch may be performed to remove both first buffer 211 and 221 and second buffer 212 and 222. In other embodiments, a first etch may be performed to remove first buffer 211 and 221, followed by a second etch to remove second buffer 212 and 222. In some embodiments, the etchant(s) used may be selective to (and thus will not remove) third buffer 213 and 223 and/or etch stop 217 and 227, which can thus protect channel 215 and 225. Even if third buffer 213 and 223 is formed of the same material as first buffer 211 and 221, third buffer 213 and 223 may protect channel 215 and 225 at least during the removal of second buffer 212 and 222. In other embodiments, the etchant(s) used may be selective to (and thus will not remove) channel 215 and 225, in which case third buffer 213 and 223 is unnecessary and may be omitted, as mentioned above.

Figure 10:
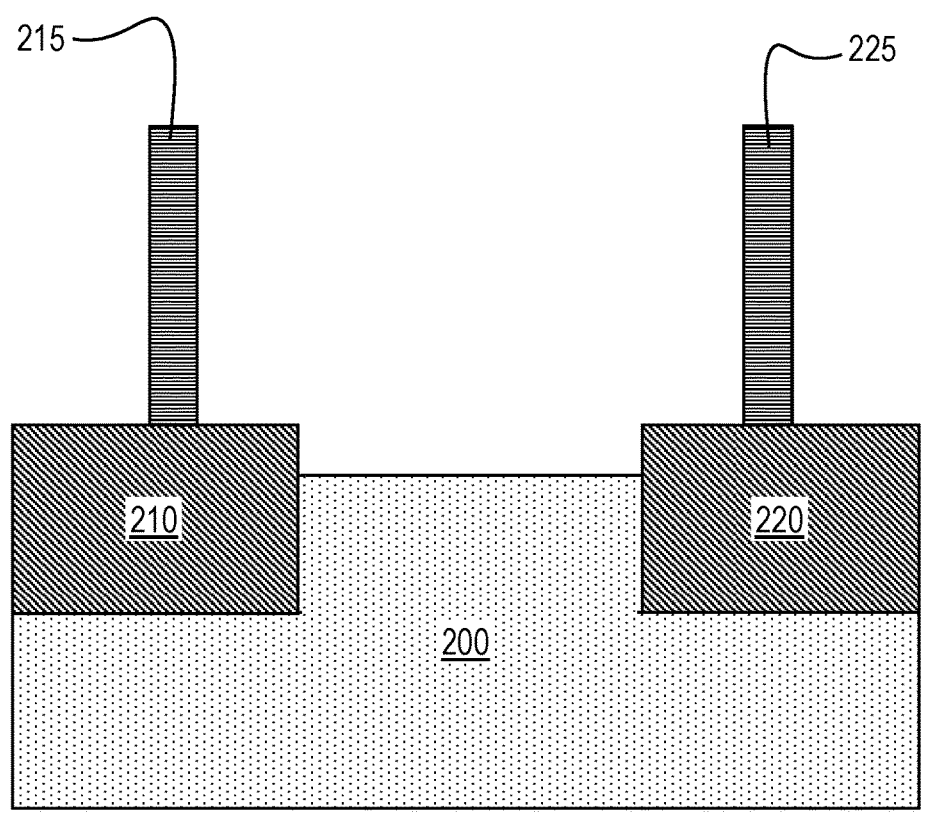

FIG. 10 shows an exemplary device after performing step 190 of method 100 shown in FIG. 1. In step 190, second dielectric fill 219 and 229, third buffer 213 and 223 (where present) and etch stop 217 and 227 are removed, preferably by wet etching. As previously noted, in some embodiments, second dielectric fill 219 and 229 is removed in step 170, and in some embodiments, third buffer 213 and 223 is omitted in step 150.

When second dielectric fill 219 and 229 is removed, etch stop 217 and 227 (and possibly third buffer 213 and 223) protects channel 215 and 225, as well as first dielectric fill 210 and 220. In some embodiments, etch stop 217 and 227 may protect channel 215 and 225 while third buffer 213 and 223 is removed, and then etch stop 217 and 227 is removed. In other embodiments, an etchant may be used which is selective to (and thus will not remove) channel 215 and 225, in which case a single etch can be used to remove third buffer 213 and 223 (if present) and etch stop 217 and 227.

After step 190, channel 215 and 225 may comprise respective III-V fins, preferably having reduced surface roughness relative to fins formed using conventional techniques. For example, the interior surfaces of fins 215 and 225 (e.g., the surfaces from which the buffers were removed) may have a surface roughness comparable to, or perhaps even less than, the exterior surfaces of fins 215 and 225 (e.g., the surfaces from which the etch stop 217 and 227 was removed). Further processing may be performed to finish forming one or more FinFETs using fins 215 and 225. Additionally or alternatively, because channels 215 and 225 are formed on dielectric 210 and 220, channels 215 and 225 may be detached and used to form gate-all-around (GAA) and/or nanowire (NW) devices, e.g., GAA FETs and/or nanowire transistors (NWT).

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input devices, and a central processor. These integrated circuits and end products would also fall within the scope of the invention.

It should again be emphasized that the above-described embodiments of the invention are intended to be illustrative only. Other embodiments may, for example, utilize different materials and processing steps from those expressly set forth above to achieve embodiments falling within the scope of the invention. These many alternative embodiments will be apparent to one having ordinary skill in the relevant arts. In other embodiments, for example, a FinFET may be formed with III-V materials, and a temporary layer modified to include an element that, when driven into a fin, allows a portion of that fin to be etched away with high selectivity to the surrounding structures.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. § 112(f). In particular, the use of "steps of" in the claims herein is not intended to invoke the provisions of AIA 35 U.S.C. § 112(f).

What is claimed is:

1. A method for use in forming a fin of a field-effect transistor, the method comprising the steps of:
    patterning a mandrel into a substrate at least by recessing portions of the substrate;
    forming dielectric material at least on the recessed portions of the substrate, wherein the dielectric material partially covers exterior sidewalls of the mandrel;
    forming a first buffer at least on a portion of the exterior sidewalls of the mandrel not covered by the dielectric material;
    forming a second buffer at least on exterior sidewalls of the first buffer;
    forming a semiconductor channel at least on the dielectric material, wherein at least the second buffer is between the channel and the mandrel;
    exposing interior sidewalls of at least the first buffer at least by removing the mandrel; and
    removing the first buffer and the second buffer without removing the channel.

2. The method of claim 1, wherein at least the recessed portions of the substrate comprise (110) silicon, and wherein at least the exterior sidewalls of the mandrel comprise (111) silicon.

3. The method of claim 1, wherein the first buffer comprises a wetting layer, and wherein the second buffer comprises an interlayer.

4. The method of claim 1, wherein the second buffer creates a single crystalline growth-front facet.

5. The method of claim 1, wherein patterning the mandrel comprises:
    forming a hard mask covering a portion of the substrate; and
    recessing portions of the substrate not covered by the hard mask;
    wherein the mandrel comprises the portions of the substrate covered by the hard mask; and
    wherein the hard mask is removed before the mandrel is removed.

6. The method of claim 5, wherein the second buffer is formed at least in part on exterior sidewalls of the hard mask.

7. The method of claim 6 wherein the first buffer is not formed on the exterior sidewalls of the hard mask.

8. The method of claim 5, wherein forming the dielectric material comprises:
    covering the exterior sidewalls of the mandrel by filling the recessed portions of the substrate with the dielectric material;
    polishing the dielectric material to the hard mask; and
    exposing the portion of the exterior sidewalls of the mandrel by recessing the first dielectric.

9. The method of claim 8, wherein the hard mask comprises a nitride, and wherein the dielectric material comprises an oxide.

10. The method of claim 8, further comprising:
    forming an etch stop on exterior sidewalls of the channel and on at least part of the dielectric material;
    forming additional dielectric material on the etch stop;
    polishing the additional dielectric material to the hard mask; and
    removing the additional dielectric material;
    wherein the etch stop protects the channel at least when the additional dielectric material is removed; and
    wherein the etch stop is removed after the additional dielectric material is removed.

11. The method of claim 10, wherein the additional dielectric material is removed when the mandrel is removed.

12. The method of claim 10, wherein the additional dielectric material is removed after the first and second buffers are removed.

13. The method of claim 10, wherein the etch stop protects the channel when removing at least the second buffer, and wherein the etch stop is removed after removing at least the second buffer.

14. The method of claim 1, wherein the exterior sidewalls of the mandrel cover interior sidewalls of the dielectric material.

15. The method of claim 14, wherein after the mandrel is removed, at least a first portion of the interior sidewalls of the dielectric material is covered by the substrate, and at least a second portion of the interior sidewalls of the dielectric material is exposed.

16. The method of claim 1, wherein the channel is formed at least in part on exterior sidewalls of the second buffer.

17. The method of claim 1, wherein:
    a third buffer is formed at least in part on exterior sidewalls of the second buffer;
    the channel is formed at least in part on exterior sidewalls of the third buffer;
    the third buffer protects the channel at least when removing the second buffer; and
    the third buffer is removed after removing the second buffer.

18. The method of claim 17, wherein:
    an etch stop is formed at least in part on exterior sidewalls of the channel;
    the etch stop protects the channel at least when removing the third buffer; and
    the etch stop is removed after removing the third buffer.

19. The method of claim 17, wherein the third buffer comprises a semiconductor, and wherein the etch stop comprises a dielectric.

20. The method of claim 1, wherein exterior sidewalls of the second buffer are at a substantially uniform distance from the mandrel.

* * * * *